US012575150B2

(12) United States Patent　　　(10) Patent No.:　US 12,575,150 B2
　　Kouno　　　　　　　　　　　　　(45) Date of Patent:　Mar. 10, 2026

(54) SEMICONDUCTOR DEVICE

(71) Applicant: DENSO CORPORATION, Kariya-city (JP)

(72) Inventor: Kenji Kouno, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 813 days.

(21) Appl. No.: 17/968,899

(22) Filed: Oct. 19, 2022

(65) Prior Publication Data

US 2023/0042174 A1　　Feb. 9, 2023

Related U.S. Application Data

(63) Continuation of application No. PCT/JP2021/016067, filed on Apr. 20, 2021.

(30) Foreign Application Priority Data

Apr. 22, 2020　(JP) ................................. 2020-076335

(51) Int. Cl.
　　*H10D 62/17*　　　(2025.01)
　　*H02M 1/08*　　　(2006.01)
　　*H03K 17/687*　　(2006.01)
　　*H10D 30/66*　　　(2025.01)
　　*H10D 30/83*　　　(2025.01)
　　*H10D 62/10*　　　(2025.01)
　　*H10D 62/832*　　(2025.01)
　　　　　　(Continued)

(52) U.S. Cl.
　　CPC ............ *H10D 62/328* (2025.01); *H02M 1/08* (2013.01); *H03K 17/6871* (2013.01); *H10D 30/665* (2025.01); *H10D 30/668* (2025.01);

*H10D 30/831* (2025.01); *H10D 62/107* (2025.01); *H10D 62/8325* (2025.01); *H10D 84/811* (2025.01); *H02P 27/06* (2013.01)

(58) Field of Classification Search
　　CPC .... H10D 30/051; H10D 30/83; H10D 62/328; H10D 30/0512; H10D 30/60; H10D 30/66; H10D 30/64; H10D 30/021; H10D 30/831
　　See application file for complete search history.

(56) References Cited

U.S. PATENT DOCUMENTS

2011/0199148 A1*　8/2011　Iwamura .............. H03K 17/567
　　　　　　　　　　　　　　　　　　　327/430
2014/0231883 A1　8/2014　Esteve et al.
2015/0137143 A1　5/2015　Konrath et al.
　　　　　　　(Continued)

OTHER PUBLICATIONS

U.S. Appl. No. 17/969,023, filed Oct. 19, 2022, Kouno.

*Primary Examiner* — Wasiul Haider
(74) *Attorney, Agent, or Firm* — Posz Law Group, PLC

(57)　　　　　　ABSTRACT

A semiconductor device includes a junction field effect transistor (JFET) including a source electrode, a drain electrode, and a gate electrode, and a metal oxide semiconductor field effect transistor (MOSFET) including a source electrode, a drain electrode, and a gate electrode. The JFET and the MOSFET are cascode-connected such that the source electrode of the JFET and the drain electrode of the MOSFET are electrically connected. A gate voltage dependency of the JFET or a capacitance ratio of a mirror capacitance of the MOSFET to an input capacitance of the MOSFET is adjusted in a predetermined range.

9 Claims, 14 Drawing Sheets

(51) Int. Cl.
    *H10D 84/80*           (2025.01)
    *H02P 27/06*           (2006.01)

(56)                 References Cited

U.S. PATENT DOCUMENTS

2015/0200662 A1 *   7/2015   Bhalla .................. H10D 84/035
                                    257/262
2020/0098935 A1     3/2020   Kono
2020/0126962 A1     4/2020   Kono

* cited by examiner

IMPURITY CONCENTRATION OF OUTER PORTION (cm$^{-3}$)

SEMICONDUCTOR DEVICE

CROSS REFERENCE TO RELATED APPLICATIONS

The present application is a continuation application of International Patent Application No. PCT/JP2021/016067 filed on Apr. 20, 2021, which designated the U.S. and claims the benefit of priority from Japanese Patent Application No. 2020-076335 filed on Apr. 22, 2020. The entire disclosures of all of the above applications are incorporated herein by reference.

TECHNICAL FIELD

The present disclosure relates to a semiconductor device in which a junction field effect transistor (JFET) and a metal oxide semiconductor field effect transistor (MOSFET) are cascode-connected.

BACKGROUND

Conventionally, the has been proposed a semiconductor device in which a normally-on JFET and a normally-off MOSFET are cascode-connected.

SUMMARY

The present disclosure provides a semiconductor device that includes a JFET including a source electrode, a drain electrode, and a gate electrode, and a MOSFET including a source electrode, a drain electrode, and a gate electrode. The JFET and the MOSFET are cascode-connected such that the source electrode of the JFET and the drain electrode of the MOSFET are electrically connected. A gate voltage dependency of the JFET or a capacitance ratio of a mirror capacitance of the MOSFET to an input capacitance of the MOSFET is adjusted in a predetermined range.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
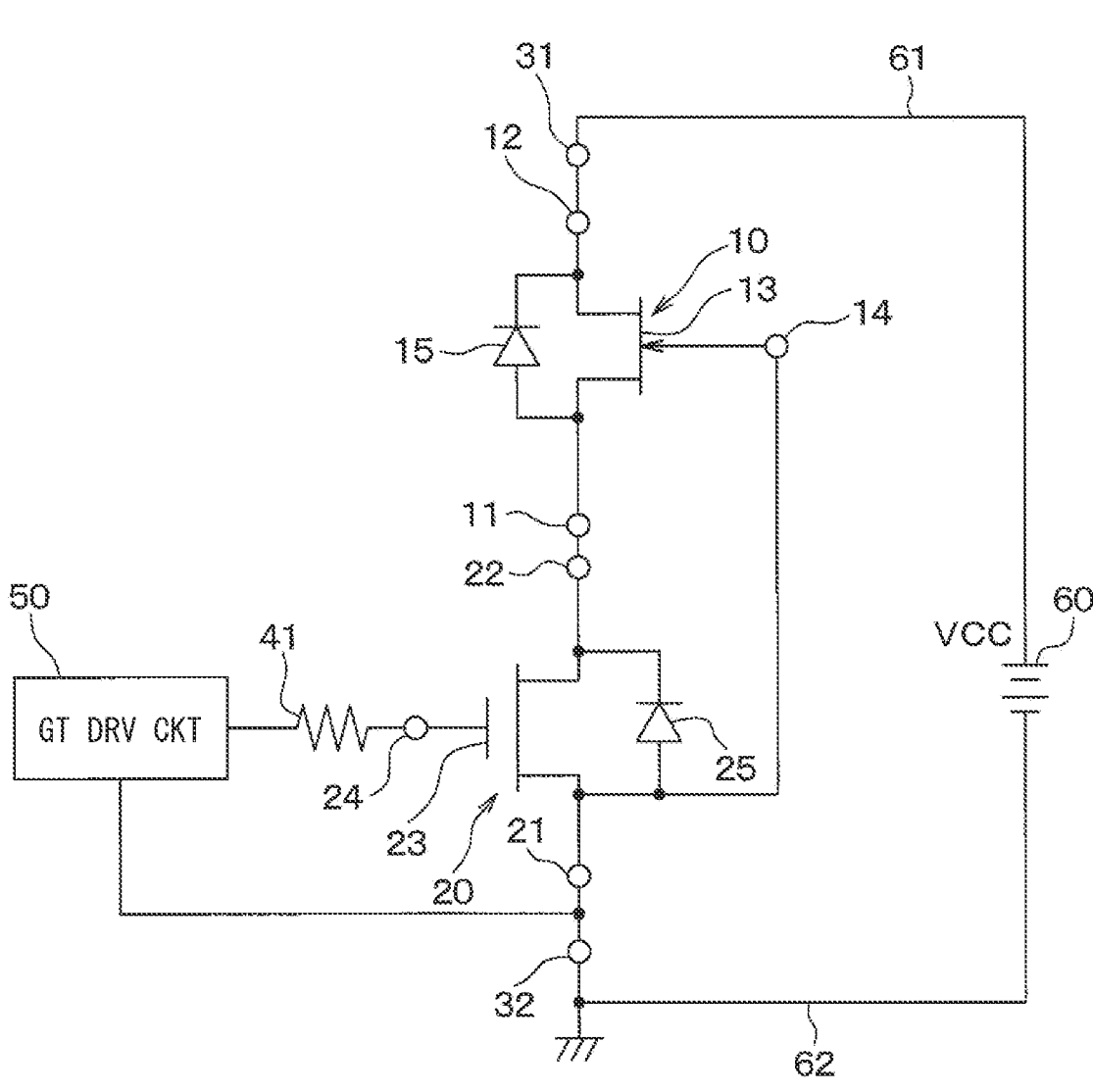
FIG. 1 is a circuit diagram of a semiconductor device according to a first embodiment.

In semiconductor devices in which a JFET and a MOS-FET are cascode-connected, the JFET may be formed using, for example, a silicon carbide substrate or a gallium nitride substrate, and a MOSFET may be formed using, for example, a silicon substrate. The JFET may have a body diode to improve a surge resistance.

In such cascode-connected semiconductor devices, it has been desired to reduce a switching loss.

A semiconductor device according to a first aspect of the present disclosure includes a JFET including a source electrode, a drain electrode, and a gate electrode, and a MOS-FET including a source electrode, a drain electrode, and a gate electrode. The JFET and the MOSFET are cascode-connected such that the source electrode of the JFET and the drain electrode of the MOSFET are electrically connected. When a drain voltage dependency of a gate voltage of the JFET is referred to as a gate voltage dependency denoted by $\Delta VgJ$, $\Delta VgJ$ is within a range equal to or greater than the following equation (1) and equal to or less than the following equation (2):

$$\Delta VgJ = (Vd \times Id - \Delta tmJ \times Id \times dV/dt)/g/(Cgd/Ciss)/(Vd - \Delta tmJ \times dV/dt) \tag{1}$$

$$\Delta VgJ = Vd/g/(Cgd/Ciss) \times (dI/dt/dV/dt) - \Delta tmJ/g/(Cgd/Ciss) \times dI/dt \tag{2},$$

where $dI/dt$ denotes a current change rate, $dV/dt$ denotes a voltage change rate, $Vd$ denotes a power supply voltage, $Id$ denotes an operating current, $\Delta tmJ$ denotes a delay time of the JFET, $Cgd$ denotes a mirror capacitance of the MOSFET, $Ciss$ denotes an input capacitance of the MOSFET, $Vm$ denotes a gate mirror potential of the MOSFET, $Vth$ denotes a gate threshold of the MOSFET, and $g$ denotes $Id/(Vm - Vth)$.

According to the semiconductor device according to the first aspect, since the gate voltage dependency is within the range equal to or greater than equation (1) and equal to or less than the equation (2), it is possible to reduce a switching loss.

A semiconductor device according to a second aspect of the present disclosure includes a JFET including a source electrode, a drain electrode, and a gate electrode, and a MOSFET including a source electrode, a drain electrode, and a gate electrode. The JFET and the MOSFET are cascode-connected such that the source electrode of the JFET and the drain electrode of the MOSFET are electrically connected. When a mirror capacitance of the MOSFET is denoted by $Cgd$, an input capacitance of the MOSFET is denoted by Ciss, and a capacitance ratio of the mirror capacitance to the input capacitance is denoted by Cgd/Ciss, Cgd/Ciss is within a range equal to or greater than the following equation (3) and equal to or less than the following equation (4):

$$Cgd/Ciss=Id/g/\Delta VgJ \tag{3}$$

$$Cgd/Ciss=(Vd/\Delta VgJ)\times dI/dt/(g\times dV/dt)-\Delta tmJ/\Delta VgJ/(g\times dI/dt) \tag{4},$$

where $\Delta VgJ$ denotes a gate voltage dependency as a drain voltage of a gate voltage of the JFET, dI/dt denotes a current change rate, dV/dt denotes a voltage change rate, Vd denotes a power supply voltage, Id denotes an operating current, $\Delta tmJ$ denotes a delay time of the JFET, Vm denotes a gate mirror potential of the MOSFET, Vth denotes a gate threshold of the MOSFET, and g denotes Id/(Vm−Vth).

According to the semiconductor device according to the second aspect, since the capacity ratio is within the range equal to or greater than the equation (3) and equal to or less than the equation (4), it is possible to reduce a switching loss.

Hereinafter, embodiments of the present disclosure will be described with reference to the drawings. In the following embodiments, the same or equivalent parts are denoted by the same reference numerals.

First Embodiment

A first embodiment will be described with reference to the drawings. First, a circuit configuration of a semiconductor device according to the present embodiment will be described. As shown in FIG. 1, the semiconductor device of the present embodiment has a normally-on JFET 10 and a normally-off MOSFET 20, and the JFET 10 and MOSFET 20 are cascode-connected. In the present embodiment, each of the JFET 10 and the MOSFET 20 is an N channel type device.

The JFET 10 includes a source electrode 11, a drain electrode 12, and a gate layer (that is, a gate electrode) 13. The MOSFET 20 includes a source electrode 21, a drain electrode 22, and a gate electrode 23.

In the JFET 10 and the MOSFET 20, the source electrode 11 of the JFET 10 and the drain electrode 22 of the MOSFET 20 are electrically connected. The drain electrode 12 of the JFET 10 is connected to a first terminal 31, and the source electrode 21 of the MOSFET 20 is connected to a second terminal 32.

The gate electrode 23 of the MOSFET 20 is connected to a gate drive circuit (GT DRV CKT) 50 via a gate pad 24 and an adjustment resistor 41. The gate layer 13 of the JFET 10 is electrically connected to the source electrode 21 of the MOSFET 20 via a gate pad 14.

Figure 4:
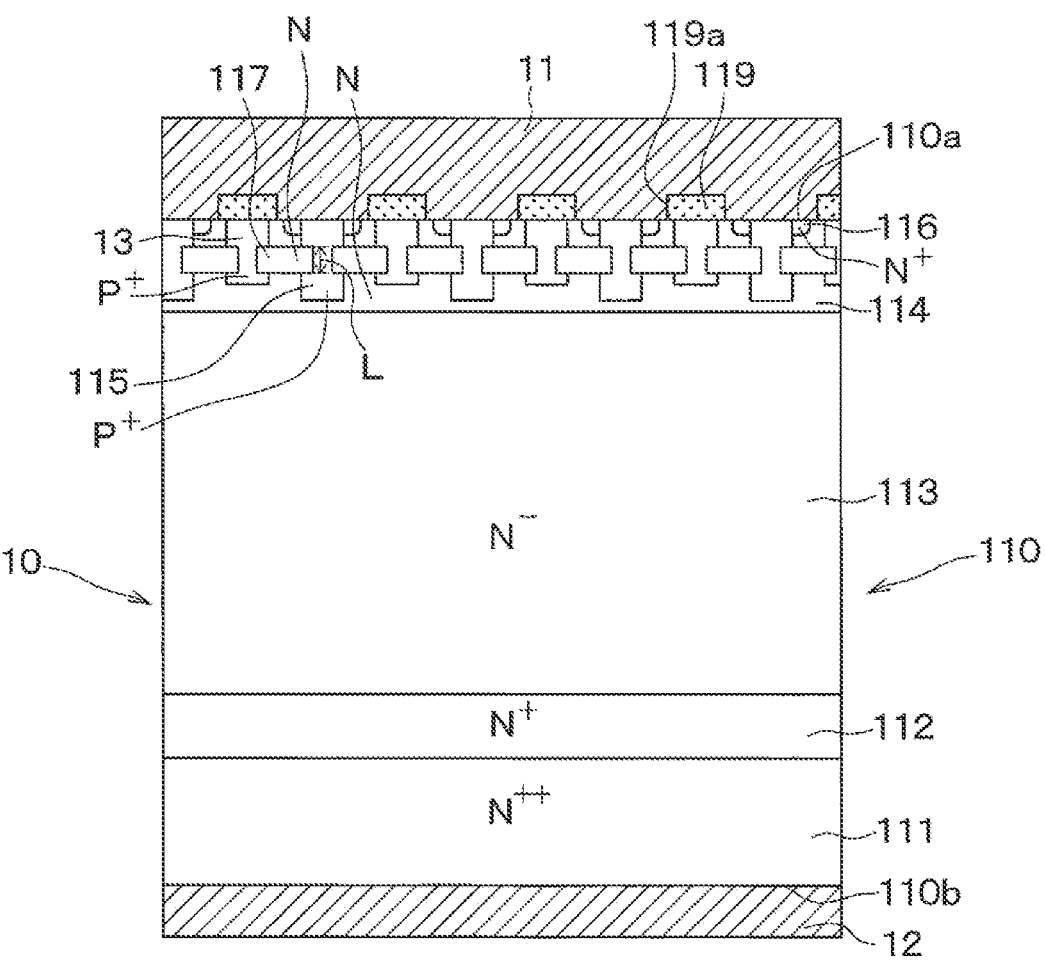
FIG. 4 is a cross-sectional view taken along a line IV-IV shown in FIG. 3.

In the present embodiment, a diode 15 is connected between the drain electrode 12 and the source electrode 11 of the JFET 10. Although the details will be described later, in the present embodiment, the JFET 10 has a P$^+$ type body layer 115 formed in an N type channel layer 114 as shown in FIG. 4. The diode 15 includes the body layer 115. The diode 15 has a cathode electrically connected to the drain electrode 12 and an anode electrically connected to the source electrode 11.

A diode 25 is connected between the drain electrode 22 and the source electrode 21 of the MOSFET 20. The diode 25 is a parasitic diode formed on the configuration of the MOSFET 20, and has a cathode electrically connected to the drain electrode 22 and an anode electrically connected to the source electrode 21.

The circuit configuration of the semiconductor device according to the present embodiment is described above. In the semiconductor device, the first terminal 31 is connected to a power supply line 61 to which a voltage Vcc is applied from a power supply 60, and the second terminal 32 is connected to a ground line 62.

Next, specific configurations of the JFET 10 and the MOSFET 20 will be described. First, the configuration of the JFET 10 will be described. The JFET 10 is formed in a first semiconductor chip 100, as shown in FIG. 2.

Figure 2:
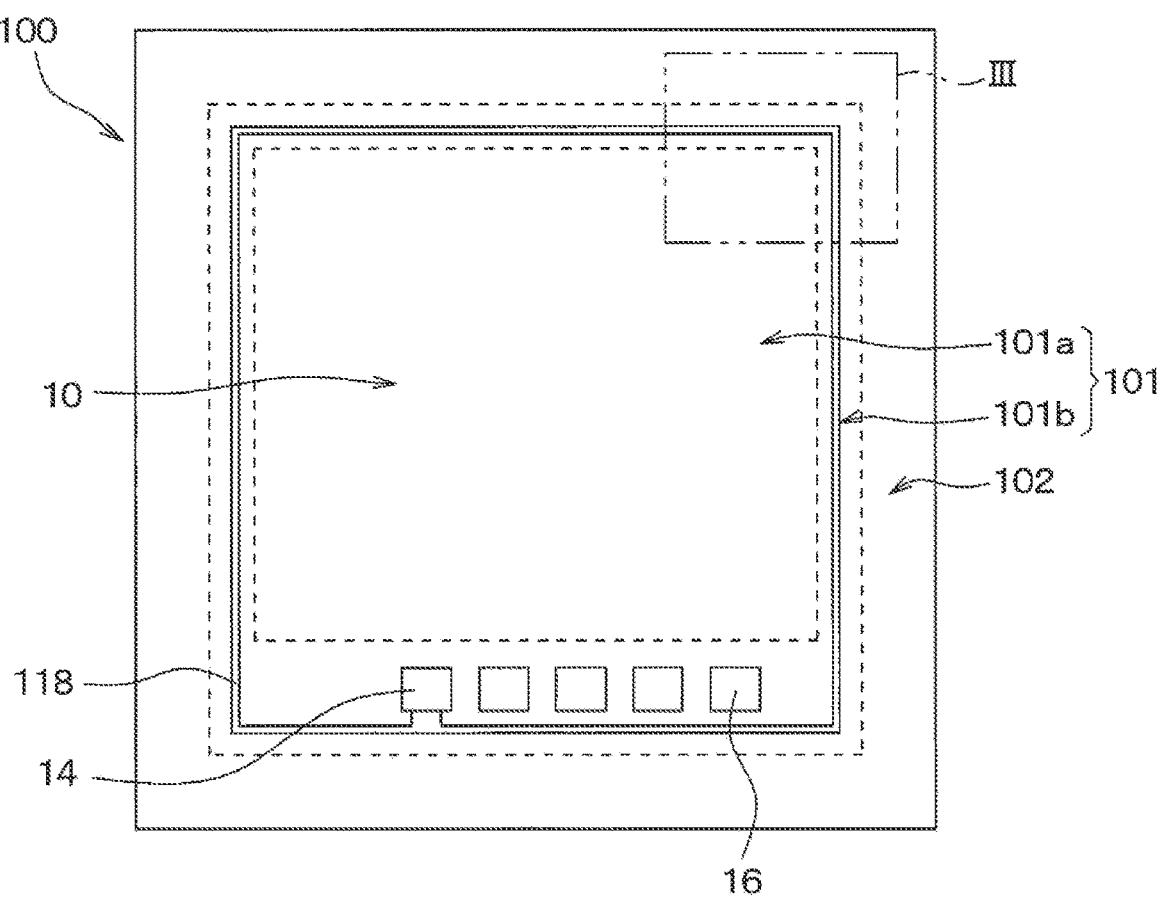
FIG. 2 is a plan view of a first semiconductor chip in which a junction field-effect transistor (JFET) is formed.
Figure 3:
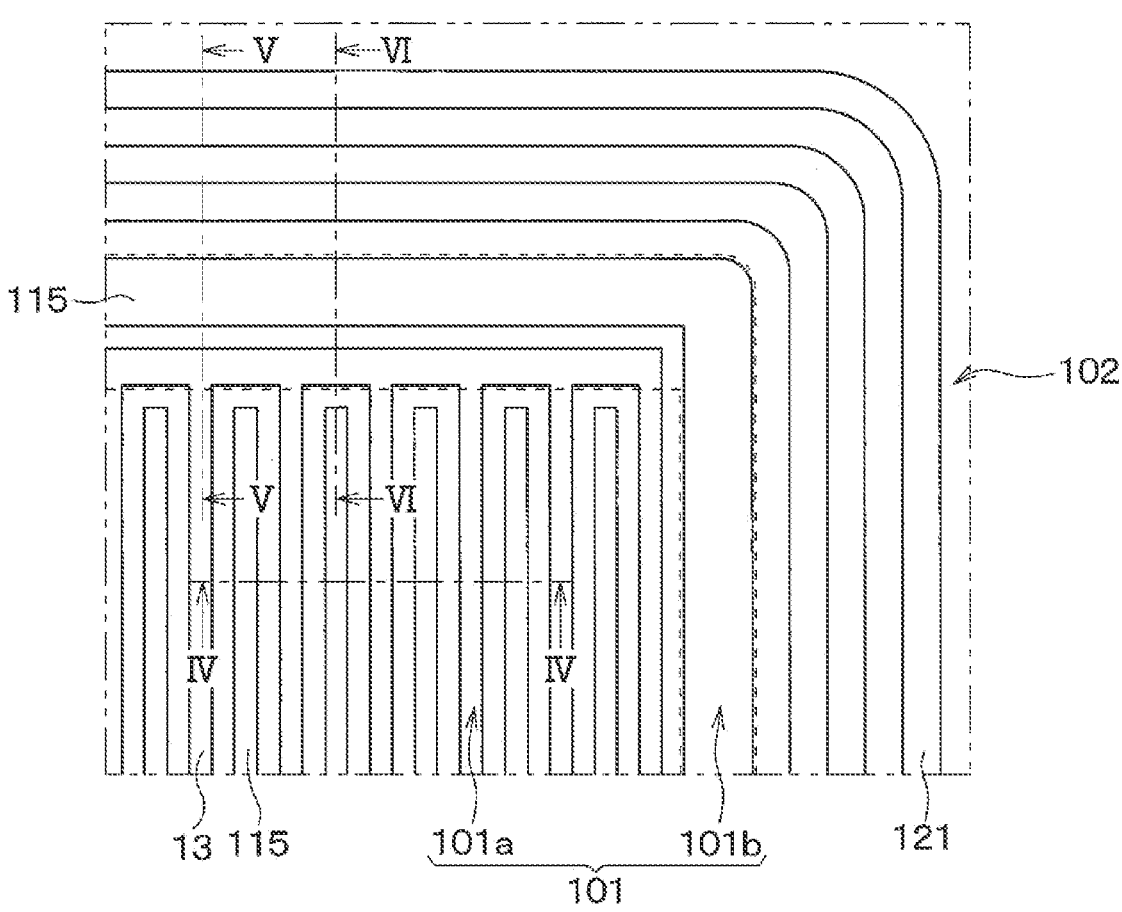
FIG. 3 is an enlarged view of a region III in FIG. 2.

As shown in FIG. 2 and FIG. 3, the first semiconductor chip 100 has a rectangular plane shape, and has a cell region 101 and an outer peripheral region 102 surrounding the cell region 101. The cell region 101 has an inner cell region 101a and an outer cell region 101b surrounding the inner cell region 101a. The JFET 10 is formed in the cell region 101.

Figure 5:
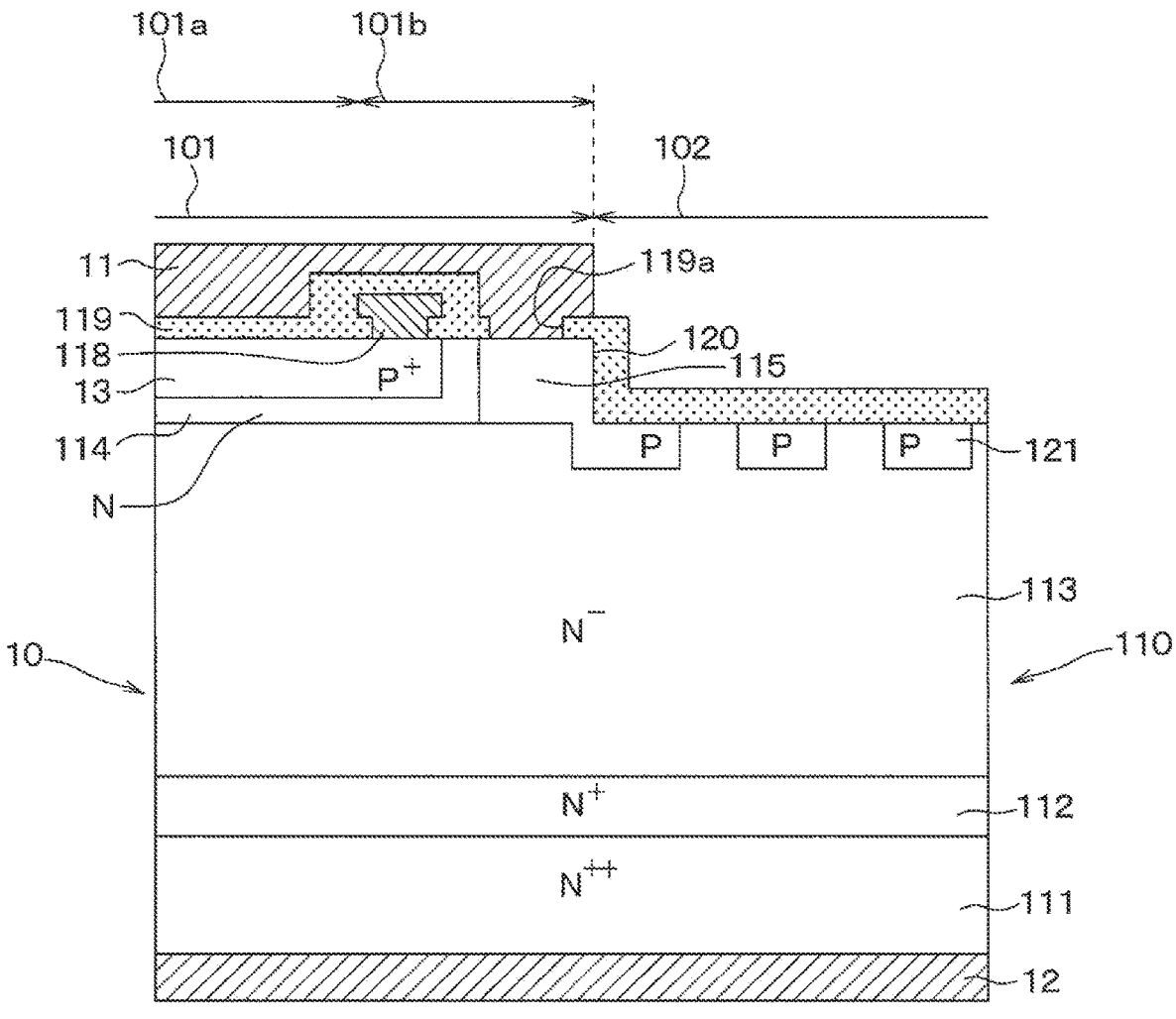
FIG. 5 is a cross-sectional view taken along a line V-V shown in FIG. 3.
Figure 6:
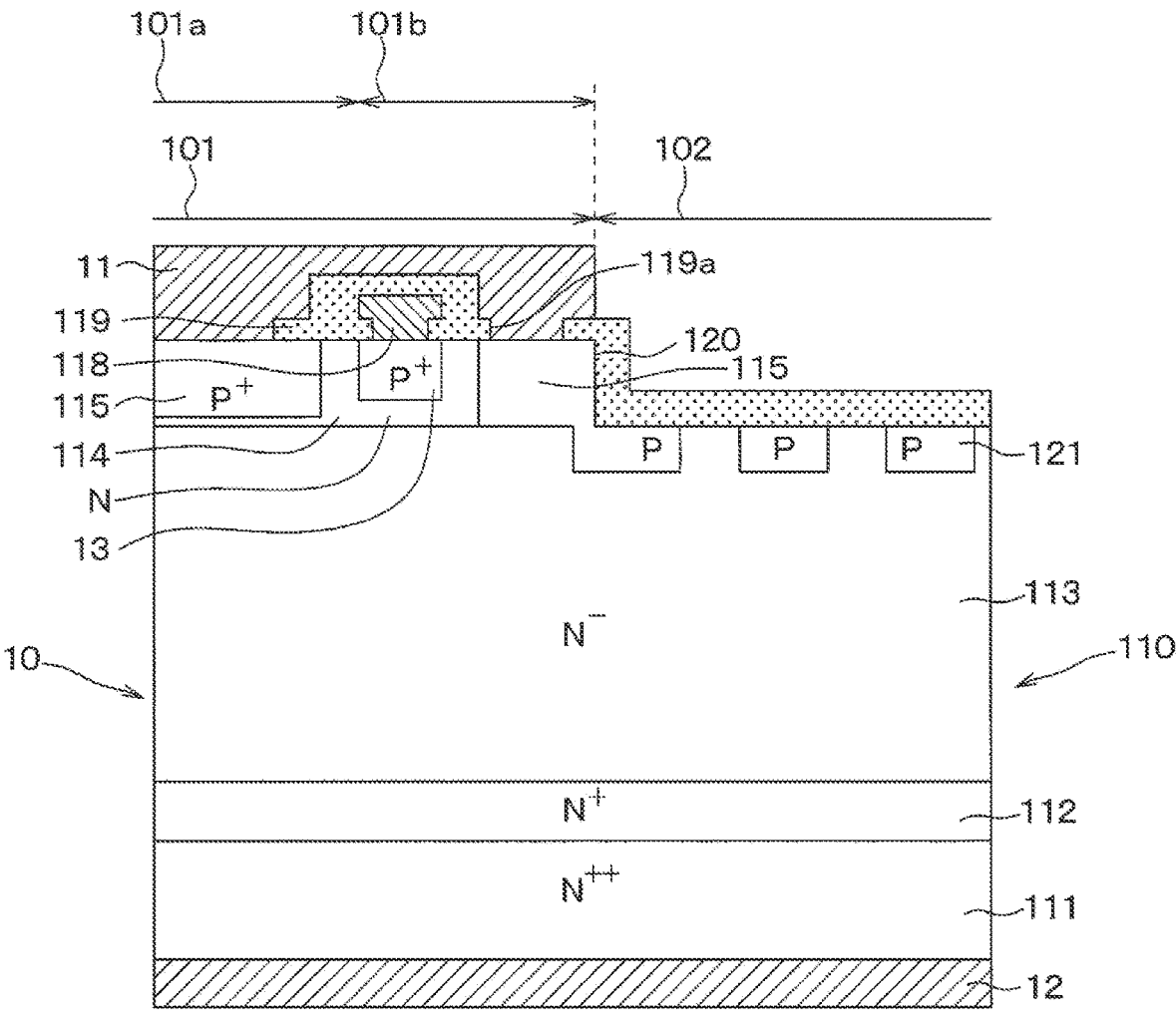
FIG. 6 is a cross-sectional view taken along a line VI-VI shown in FIG. 3.

Specifically, as shown in FIGS. 4 to 6, the first semiconductor chip 100 includes a semiconductor substrate 110 having a drain layer 111 made of an N$^{++}$ type silicon carbide (hereinafter referred to as SiC) substrate. Then, an N$^+$ type buffer layer 112 having an impurity concentration lower than that of the drain layer 111 is disposed on the drain layer 111, and an N$^-$ type drift layer 113 having an impurity concentration lower than that of the buffer layer 112 is disposed on the buffer layer 112. The buffer layer 112 and the drift layer 113 are formed, for example, by growing an epitaxial film made of SiC on the SiC substrate constituting the drain layer 111.

In the cell region 101, the channel layer 114, the gate layer 13, the body layer 115, and a source layer 116 are formed to a portion close to one surface 110a of the semiconductor substrate 110. Specifically, in the cell region 101, the N type channel layer 114 having a higher impurity concentration than the drift layer 113 is disposed on the drift layer 113. The channel layer 114 is formed by growing, for example, an epitaxial film of SiC. The one surface 110a of the semiconductor substrate 110 includes a surface of the channel layer 114.

In the channel layer 114, the P$^+$ type gate layer 13 and the P$^+$ type body layer 115 having a higher impurity concentration than the channel layer 114 are formed. In the present embodiment, the gate layer 13 and the body layer 115 have the same impurity concentration and are formed in a depth direction from the one surface 110a of the semiconductor substrate 110 (that is, the surface of the channel layer 114). However, in the present embodiment, the body layer 115 is formed deeper than the gate layer 13. In other words, the body layer 115 protrudes toward the drain layer 111 more than the gate layer 13.

In addition, the gate layer 13 and the body layer 115 extend along a first direction in a planar direction of the semiconductor substrate 110, and are alternately arranged in a second direction that is included in the planar direction and is orthogonal to the first direction. In other words, in FIG. 4, the gate layer 13 and the body layer 115 extend along a direction perpendicular to a paper plane and are alternately arranged along a horizontal direction of the paper plane while being separated from each other. The depth direction of the semiconductor substrate 110 may also be referred to as a stacking direction of the drain layer 111, the drift layer 113 and the channel layer 114. The gate layer 13 and the body layer 115 are formed by, for example, ion implantation or growing a buried epitaxial film of SiC.

In the present embodiment, as shown in FIGS. 3, 5 and 6, the gate layer 13 extends from the inner cell region 101a to the outer cell region 101b. The gate layer 13 has an annular structure by bending and connecting both ends in the extending direction located in the outer cell region 101b, and the annular structures are connected to each other. For this reason, the body layer 115 in FIG. 4 is disposed in a portion on an inner side of the gate layer 13 having the annular structure.

The body layer 115 is also formed in outer cell region 101b, and is connected to one of a plurality of guard rings 121 formed in the outer peripheral region 102, as will be described later.

As shown in FIG. 4, the N⁺ type source layer 116 having a higher impurity concentration than the channel layer 114 is formed in a surface layer portion of the channel layer 114 so as to be in contact with the body layer 115. Furthermore, an N type adjustment region 117 is formed between the gate layer 13 and the body layer 115 in the channel layer 114 of the present embodiment. The function of the adjustment region 117 will be specifically described later. The source layer 116 and the adjustment region 117 are formed by ion implantation, for example.

As shown in FIGS. 2, 5 and 6, above the semiconductor substrate 110, the gate pad 14 and a gate wiring 118 electrically connecting the gate pad 14 and the gate layer 13 are formed in the outer cell region 101b. Although not shown, the first semiconductor chip 100 also has a temperature sensor, a current sensor, and the like. Pads 16 electrically connected to these various sensors and wirings (not shown) are also formed in the outer cell region 101b.

As shown in FIGS. 4 to 6, an interlayer insulating film 119 is formed on the one surface 110a of the semiconductor substrate 110 so as to cover the gate wiring 118. The interlayer insulating film 119 is formed in the cell region 101 and the outer peripheral region 102. The interlayer insulating film 119 has contact holes 119a in the cell region 101 to expose the channel layer 114, the body layer 115, and the source layer 116. A source electrode 11 electrically connected to the source layer 116 and the body layer 115 through the contact holes 119a is formed on the interlayer insulating film 119.

A drain electrode 12 that is electrically connected to the drain layer 111 is formed on the other surface 110b of the semiconductor substrate 110.

As shown in FIGS. 5 and 6, the outer peripheral region 102 has a mesa structure having a recessed portion 120. The recessed portion 120 is formed by removing a portion corresponding to the channel layer 114 in the cell region 101. The guard rings 121 having a multiple ring structure surrounding the cell region 1 are formed in the outer peripheral region 102. In the present embodiment, one of the guard rings 121 closest to the cell region 101 is electrically connected to the body layer 115 formed in the outer cell region 101b. Alternatively, the one of the guard rings 121 closest to the cell region 101 may not be electrically connected to the body layer 115.

The above is the configuration of the first semiconductor chip 100 of the present embodiment. In the first semiconductor chip 100 of the present embodiment, the N⁻ type, the N type, the N⁺ type, and the N⁺⁺ type correspond to a first conductivity type, and the P type and the P⁺ type correspond to a second conductivity type. In the present embodiment, the semiconductor substrate 110 includes the drain layer 111, the buffer layer 112, the drift layer 113, the channel layer 114, the body layer 115, the source layer 116, the adjustment region 117, and the gate layer 13, as described above. Further, in the present embodiment, as described above, the drain layer 111 is formed of a SiC substrate, and the buffer layer 112, the drift layer 113, the channel layer 114 and the like are formed by growing an epitaxial film made of SiC.

Therefore, it can be said that the first semiconductor chip 100 of the present embodiment is a SiC semiconductor device. In the present embodiment, the P type body layer 115 is formed in the first semiconductor chip 100. The diode 15 in FIG. 1 is formed due to body layer 115.

Figure 7:
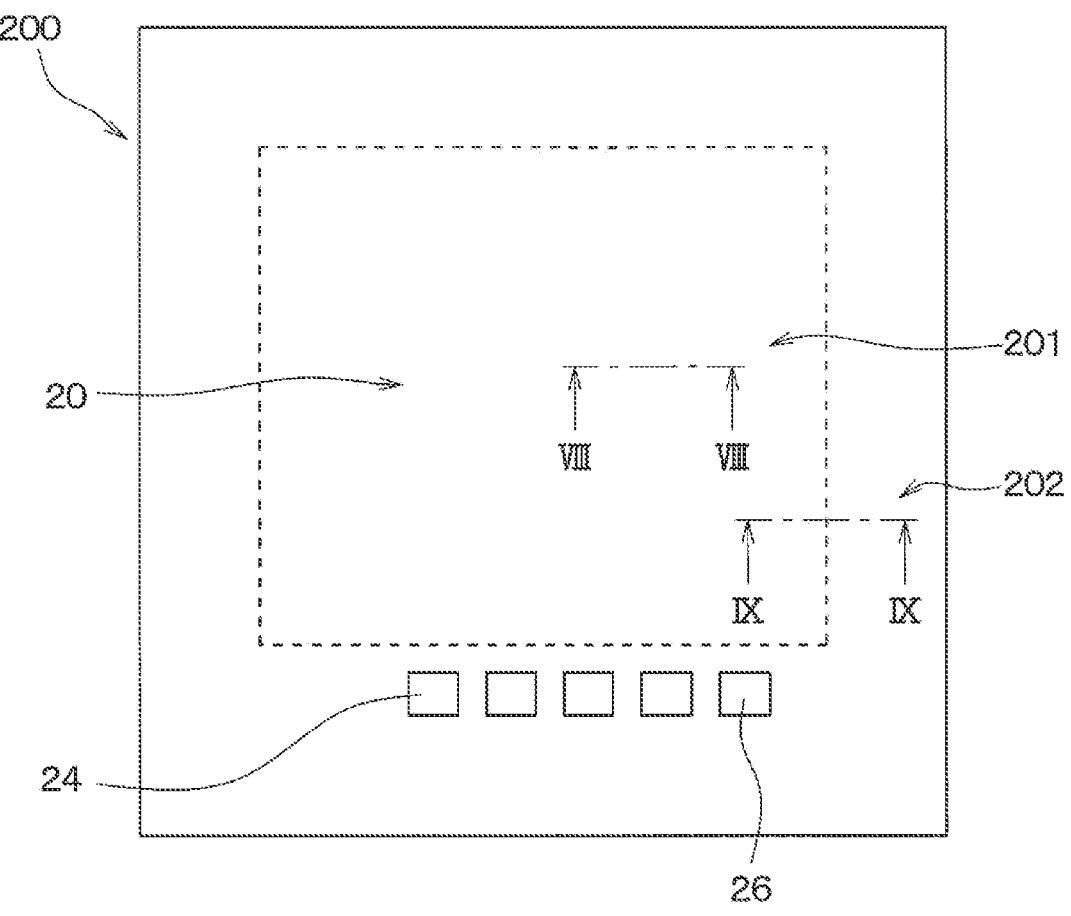
FIG. 7 is a plan view of a second semiconductor chip in which a MOSFET is formed.

Next, the configuration of the MOSFET 20 will be described. The MOSFET 20 is formed on a second semiconductor chip 200, as shown in FIG. 7.

The second semiconductor chip 200 has a rectangular plane shape, and has a cell region 201 and an outer peripheral region 202 surrounding the cell region 201. The MOSFET 20 is formed in the cell region 201.

Figure 8:
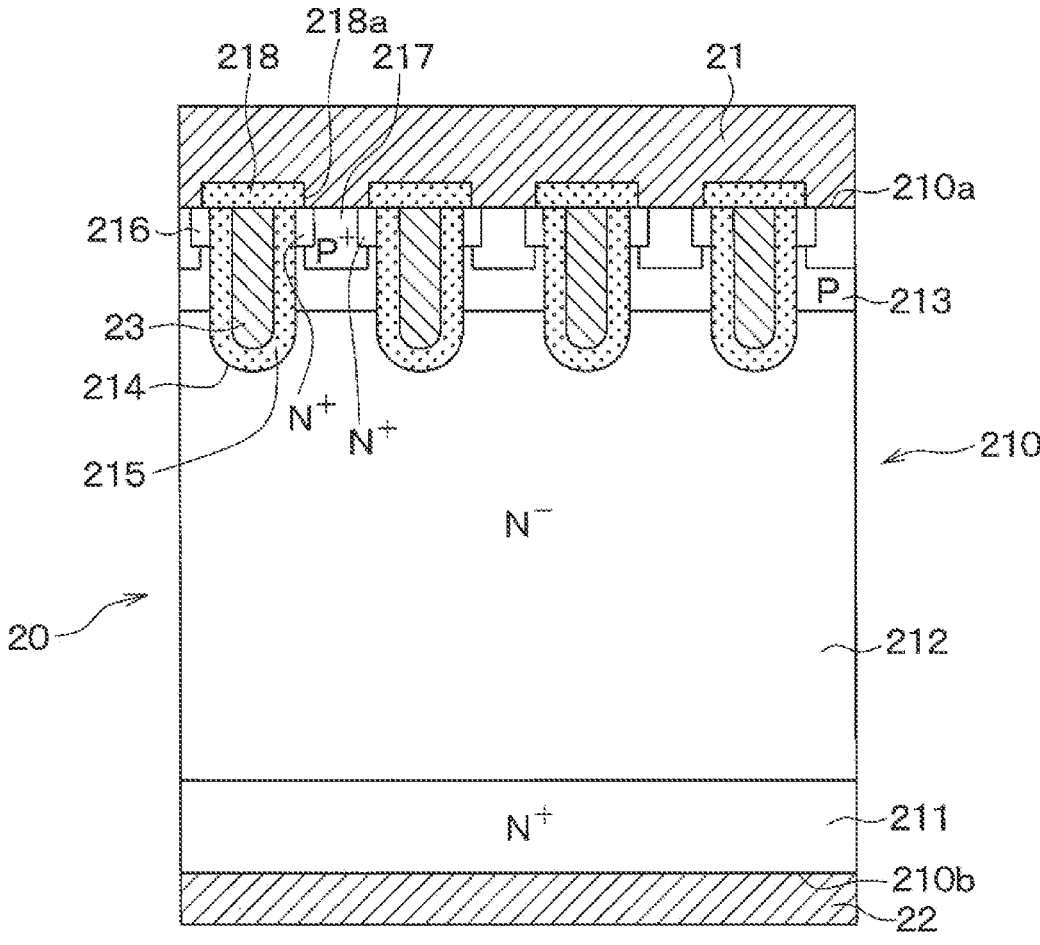
FIG. 8 is a cross-sectional view taken along a line VIII-VIII in FIG. 7.
Figure 9:
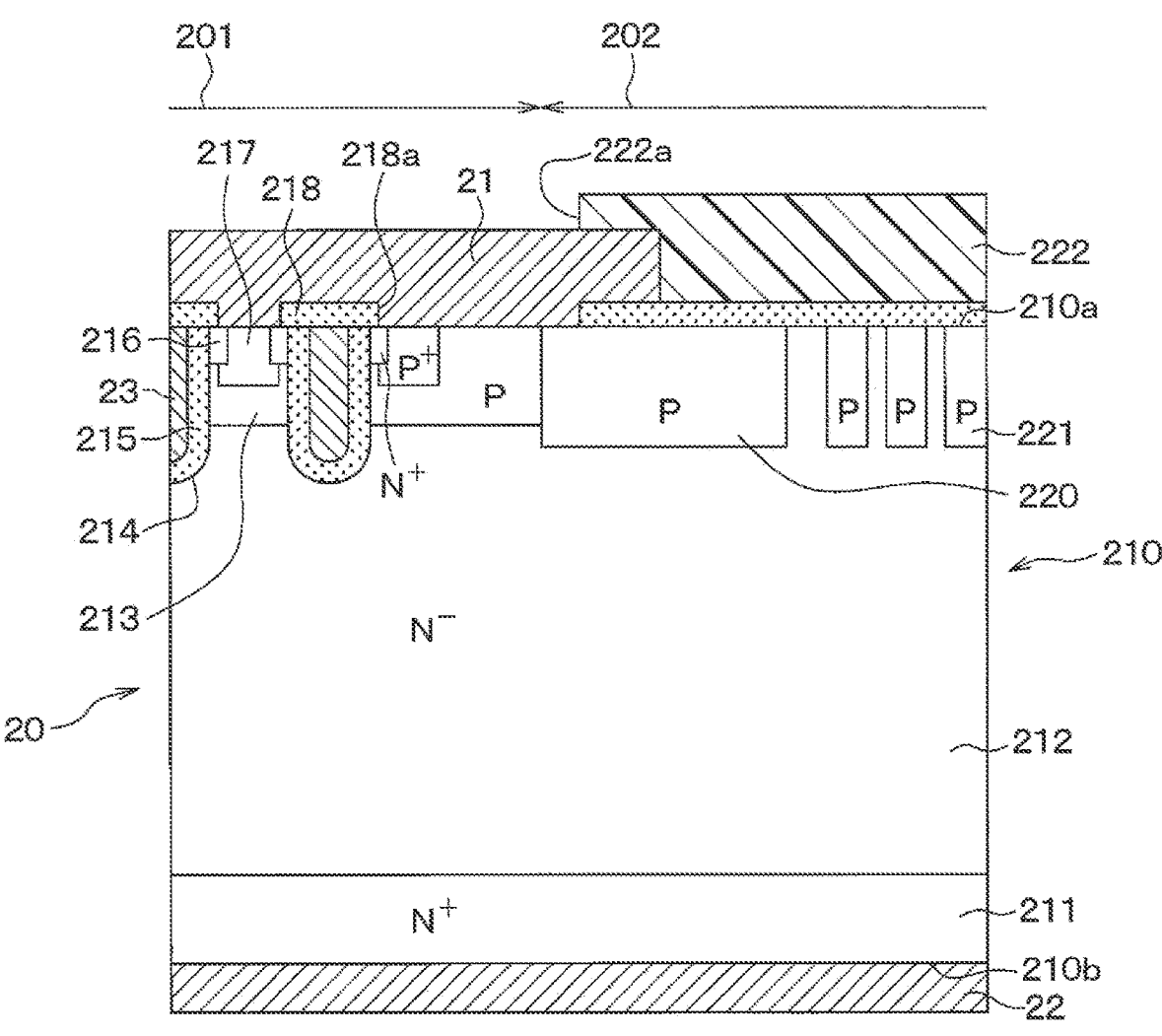
FIG. 9 is a cross-sectional view taken along a line IX-IX in FIG. 7.

Specifically, as shown in FIGS. 8 and 9, the second semiconductor chip 200 includes a semiconductor substrate 210 having a drain layer 211 made of an N⁺ type silicon carbide (hereinafter referred to as SiC) substrate. An N type drift layer 212 having a lower impurity concentration than the drain layer 211 is disposed on the drain layer 211. In the cell region 201, a P type channel layer 213 having a higher impurity concentration than the drift layer 212 is disposed on the drift layer 212.

In addition, a plurality of trenches 214 are formed in the semiconductor substrate 210 so as to penetrate the channel layer 213 and reach the drift layer 212, and the channel layer 213 is separated into a plurality of portions by the trenches 214. In this embodiment, the plurality of trenches 214 are formed in stripes at equal intervals along one direction in a planar direction of one surface 210a of the semiconductor substrate 210 (that is, a direction perpendicular to a paper plane of FIG. 8). Note that the plurality of trenches 214 may have an annular structure by bending tip portions thereof.

Each of the trenches 214 is embedded with a gate insulating film 215 formed to cover an inner wall surface of each of the trenches 214, and a gate electrode 23 formed on the gate insulating film 215. The gate electrode 23 is formed of polysilicon or the like. Accordingly, the trench gate structure is formed.

In the channel layer 213, an N⁺ type source layer 216 and a P⁺ type contact layer 217 are formed so as to be sandwiched between the source layer 216. The source layer 216 is configured to have a higher impurity concentration than the drift layer 212, is terminated in the channel layer 213, and is in contact with a side wall of the trench 214. The contact layer 217 has a higher impurity concentration than the channel layer 213 and is formed so as to terminate in the channel layer 213, similarly to the source layer 216.

To be more specific, the source layer 216 is extended in a rod shape to be in contact with the side wall of the trench 214 along the longitudinal direction of the trench 214 in a region between adjacent two of the trenches 214, and terminated inside a tip of the trench 214. The contact layer 217 is sandwiched between two source layers 216 and extends in a rod shape along the longitudinal direction of the trench 214 (that is, the source layer 216). Note that the contact layer 217 of the present embodiment is formed deeper than the source layer 216 with respect to the one surface 210a of the semiconductor substrate 210.

An interlayer insulating film 218 is formed on the channel layer 213 (that is, the one surface 210a of the semiconductor substrate 210). The interlayer insulating film 218 is also formed in the outer peripheral region 202 as shown in FIG. 9. In the interlayer insulating film 218, a contact hole 218a exposing a part of the source layer 216 and the contact layer 217 is formed. On the interlayer insulating film 218, the source electrode 21 electrically connected to the source layer 216 and the contact layer 217 through the contact hole 218a is formed.

A drain electrode 22 that is electrically connected to the drain layer 211 is formed on the other surface 210*b* of the semiconductor substrate 210.

In the outer peripheral region 202, as shown in FIG. 7, the gate pads 24, gate wirings (not shown), and the like are formed. The gate wirings are electrically connected to the gate electrodes 23 respectively in a cross section different from that in FIGS. 8 and 9. Although not shown, the second semiconductor chip 200 also has a temperature sensor, a current sensor, and the like. In the outer peripheral region 202, pads and wirings (not shown) electrically connected to various sensors are also formed.

Furthermore, in the outer peripheral region 202, a P type deep layer 220 is formed in an inner portion close to the cell region 201, and a plurality of P type guard rings 221 having a multi-ring structure is formed in an outer portion that is outer than the deep layer 220. The deep layer 220 of the present embodiment is connected to the channel layer 213 and is formed deeper than the channel layer 213. A protective film 222 covering the interlayer insulating film 218 is formed in the outer peripheral region 202, and the protective film 222 has an opening 222*a* to expose the source electrode 21.

The above is the configuration of the second semiconductor chip 200 of the present embodiment. In the second semiconductor chip 200 of the present embodiment, the N type, N⁻ type, the N⁺ type, and the N⁺⁺ type correspond to a first conductivity type, and the P type and the P⁺ type correspond to a second conductivity type. In the present embodiment, the semiconductor substrate 210 includes the drain layer 211, the drift layer 212, the channel layer 213, the source layer 216, and the contact layer 217 as described above. Furthermore, in the present embodiment, the second semiconductor chip 200 is configured using the Si substrate as described above. Therefore, it can be said that the second semiconductor chip 200 is a Si semiconductor device.

In the semiconductor device of the present embodiment, although not shown, the JFET 10 formed in the first semiconductor chip 100 and the MOSFET 20 formed in the second semiconductor chip 200 are electrically connected so as to be cascode-connected.

Next, the basic operation of the above semiconductor device will be described. Since the semiconductor device of the present embodiment has the MOSFET 20 that is normally-off, the semiconductor device operates as a normally-off device as a whole.

First, in order to turn on the semiconductor device by a switching-on operation, a gate voltage equal to or higher than a threshold voltage is applied from the gate drive circuit 50 to the gate electrode 23 of the MOSFET 20. As a result, the normally-off type MOSFET 20 turns on. In the JFET 10, the gate layer 13 is connected to the second terminal 32. For this reason, the normally-on type JFET 10 turns on because the potential difference between the gate layer 13 and the source electrode 11 is almost zero. Therefore, a current flows between the first terminal 31 and the second terminal 32, and the semiconductor device finally turns on.

Next, in order to turn off the semiconductor device by a switching-off operation, the gate voltage applied to the gate electrode 23 of the MOSFET 20 is made smaller than the threshold voltage (for example, set to 0 V). As a result, the normally-off type MOSFET 20 turns off. Further, when the MOSFET 20 turns off, the voltage of the drain electrode 22 of the MOSFET 20 and the voltage of the source electrode 11 of the JFET 10 connected thereto increases, and an electric potential is generated between the gate layer 13 of the JFET 10 connected to the second terminal 32 and the source electrode 11. When the potential difference between the source electrode 11 and the gate layer 13 reaches the threshold, the channel disappears and the JFET 10 turns off. As a result, no current flows between the first terminal 31 and the second terminal 32, and the semiconductor device finally turns off.

The present inventor have made intensive studies to reduce a switching loss of the above semiconductor device, and obtained the following results. That is, the inventor found that the switching loss can be adjusted by adjusting a drain voltage dependency ΔVgJ of the gate voltage of the JFET 10, and obtained the results shown in FIG. 10. In the following description, the drain voltage dependency ΔVgJ of the gate voltage of the JFET 10 is also simply referred to as a gate voltage dependency ΔVgJ.

Specifically, the present inventor have investigated the relationship between the gate voltage dependency ΔVgJ and a switching loss Et (dI/dt) defined by a current change rate dI/dt (hereinafter also simply referred to as dI/dt). In addition, the present inventor have investigated the relationship between the gate voltage dependency ΔVgJ and a switching loss Et (dV/dt) defined by a voltage change rate dV/dt (hereinafter also simply referred to as dV/dt). Furthermore, the present inventor have investigated the relationship between the gate voltage dependency ΔVgJ and the total switching loss Esum (Et(dI/dt)+Et (dV/dt)), which is the sum of the switching loss Et(dI/dt) and the switching loss Et(dV/dt).

Figures 10, 11:
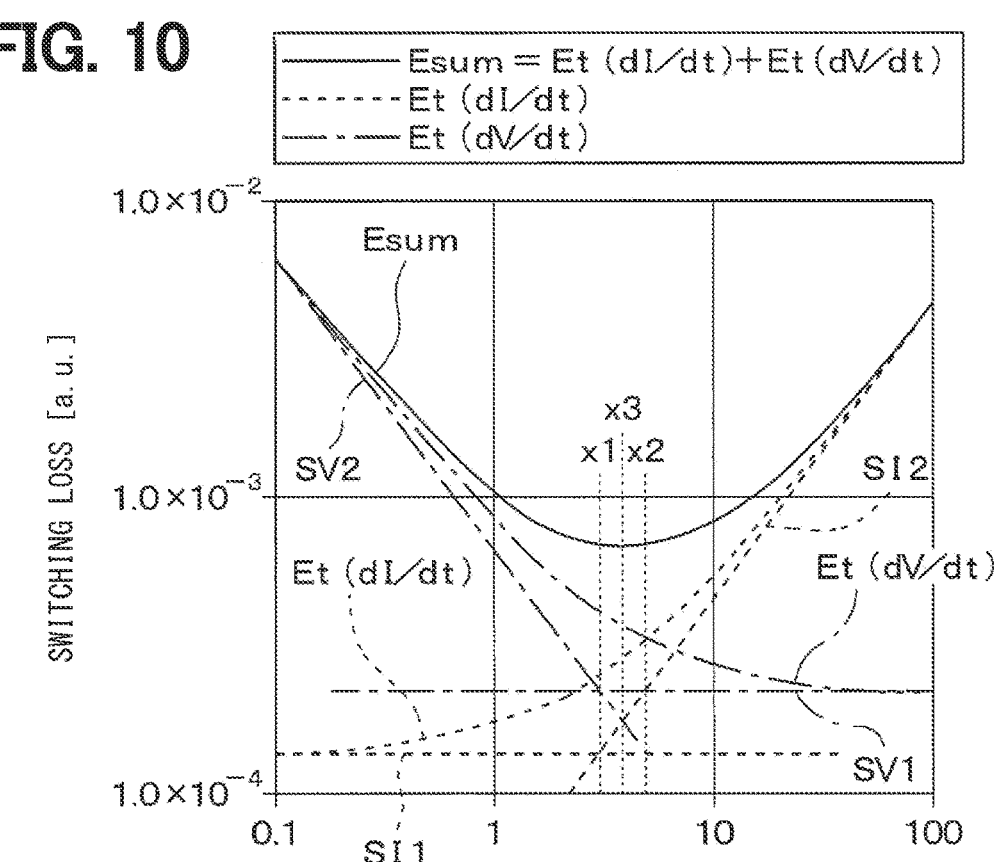
FIG. 10 is a diagram showing simulation results regarding the relationship between a gate voltage dependency and a switching loss.
FIG. 11 is a diagram showing simulation results regarding the relationship between a dosage of an adjustment region and the gate voltage dependency.

Note that dI/dt relates to a self-surge, and dV/dt corresponds to a system surge such as a motor surge that may occur in a system such as an inverter. Et(dI/dt) in FIG. 10 is the simulation result at 5 kA/μs, and Et(dV/dt) is the simulation result at 30 kV/μs.

The gate voltage dependency ΔVgJ and each switching loss will be specifically described below. In the following, a change from a situation of the flow of the current in the semiconductor to a situation of the cutoff of the current may be referred to as turn-off of the semiconductor device, and a change from a situation in which the current does not flow in the semiconductor device to a situation in which the current flows in the semiconductor device may be referred to as turn-on of the semiconductor device. Eoff denotes a switching loss when turning off the semiconductor device, Eon denotes a switching loss when turning on the semiconductor device, Vd denotes a power supply voltage, Id denotes an operating current, toff denotes an off-time, ton denotes an on-time, and tm denotes a mirror time. In addition, Rg denotes a gate resistance of the MOSFET 20, Cgd denotes a mirror capacitance of the MOSFET 20, Ciss denotes an input capacitance of the MOSFET 20, Vm denotes a gate mirror potential of the MOSFET 20, Vg denotes a gate drive voltage of the MOSFET 20, and Vth denotes the gate threshold of the MOSFET 20 (where Vth>0). Furthermore, ΔtmJ denotes a delay time of the JFET 10, CgsJ denotes a gate-source capacitance of the JEET 10, VthJ denotes a gate threshold of the JFET 10 (where VthJ<0), CgdJ denotes a gate-drain capacitance of the JFET 10, VgJ denotes a gate potential of the JFET 10, and RJ denotes a parasitic gate resistance of the JFET 10.

First, the switching-off loss Eoff when the semiconductor device is turned off is expressed by the following equation (5).

$$Eoff = Vd \times Id / \{2 \times (tm + toff)\} \tag{5}$$

The term tm in the equation (5) is expressed by the following equation (6).

$$tm = (Rg \times Cgd \times \Delta VgJ)/Vm + \Delta tmJ \tag{6}$$

The term $\Delta tmJ$ in the equation (6) is expressed by the following equation (7).

$$\Delta tmJ = (CgsJ \times |VthJ| + CgdJ \times Vd)/(VgJ/RJ) \tag{7}$$

The term $toff$ in the equation (5) is expressed by the following equation (8).

$$toff = Rg \times Ciss \times \ln(Vm/Vth) \tag{8}$$

At the time of switching off, $dV/dt$ is expressed by the following equation (9) and $dI/dt$ is expressed by the following equation (10).

$$dV/dt = Vd/tm \tag{9}$$

$$dI/dt = Id/toff \tag{10}$$

The switching-on loss $Eon$ when turning on the semiconductor device is expressed by the following equation (11).

$$Eon = Vd \times Id/\{2 \times (tm + ton)\} \tag{11}$$

The term $tm$ in the equation (11) is expressed by the following equation (12).

$$tm = \{Rg \times Cgd \times \Delta VgJ\}/(Vg - Vm)\} + \Delta tmJ \tag{12}$$

The term $\Delta tmJ$ in the equation (12) is expressed by the following equation (13). The equation (13) is the same as the equation (7) described above.

$$\Delta tmJ = (CgsJ \times |VthJ| + CgdJ \times Vd)/(VgJ/RJ) \tag{13}$$

The term $ton$ in the equation (11) is expressed by the following equation (14).

$$ton = Rg \times Ciss \times \ln\{(Vg - Vth)/(Vg - Vm)\} \tag{14}$$

At the time of switching on, $dV/dt$ is expressed by the following equation (15) and $dI/dt$ is expressed by the following equation (16).

$$dV/dt = Vd/tm \tag{15}$$

$$dI/dt = Id/ton \tag{16}$$

In this case, the switching loss $Et(dI/dt)$ defined by $dI/dt$ is expressed by the following equation (17).

$$Et(dI/dt) = Eon + Eoff + Err \tag{17}$$

$Eff$ and $Eon$ of the switching loss $Et(dI/dt)$ are respectively indicated by the following equations (18) and (19).

$$Eoff = Vd \times Id^2/2 \times [1 + \{Cgd \times \Delta VgJ/(Vm \times Ciss)/\ln(Vm/Vth)\} + dI/dt/(Id \times \Delta tmJ)]/dI/dt \tag{18}$$

$$Eon = Vd \times Id^2/2 \times [1 + \Delta VgJ \times Cgd)/\{(Vg - Vm) \times Ciss\}/\ln\{(Vg - Vth)/(Vg - Vm)\} + dI/dt/(Id \times \Delta tmJ)]/dI/dt \tag{19}$$

Since the recovery loss $Err$ is normally sufficiently small with respect to $Eon$ and $Eoff$, the recovery loss $Err$ is ignored in the equations (18) and (19). Similarly, the switching loss $Et(dV/dt)$ defined by $dV/dt$ is expressed by the following equation (20).

$$Et(dV/dt) = Eon + Eoff + Err \tag{20}$$

$Eff$ and $Eon$ of the switching loss $Et(dI/dt)$ are respectively expressed by the following equations (21) and (22).

$$Eoff = Vd^2 \times Id/2 \times [1 + (1 - \Delta tmJ \times dV/dt/Vd) \times (Vm/Cgd/\{\Delta VgJ \times Ciss \times \ln(Vm/Vth)\})]/dv/dt \tag{21}$$

$$Eon = Vd^2 \times Id/2 \times [1 + \{1 - dV/dt/(Vd \times \Delta tmJ)\} \times Ciss \times \ln\{(Vg - Vth)/(Vg - Vm)\} \times (Vg - Vm)/Cgd/\Delta VgJ]/dV/dt \tag{22}$$

Since the recovery loss $Err$ is normally sufficiently small with respect to $Eon$ and $Eoff$, the recovery loss $Err$ is ignored in the equations (21) and (22).

As shown in FIG. 10, the switching loss $Et$ ($dV/dt$) decreases with increase of the gate voltage dependency $\Delta VgJ$, and the switching loss $Et$ ($dI/dt$) increases with increase of the gate voltage dependency $\Delta VgJ$. In other words, the switching loss $Et$ ($dV/dt$) and the switching loss ($dI/dt$) have an opposite relationship with respect to the gate voltage dependency $\Delta VgJ$. The semiconductor device may be configured such that both of the switching loss $Et(dV/dt)$ and the switching loss $Et(dI/dt)$ are small. In other words, the semiconductor device may be configured to decrease the total switching loss $Esum$. Therefore, the semiconductor device of the present embodiment is configured as follows.

A tangent at a point where an inclination (that is, the absolute value) of the switching loss $Et$ ($dI/dt$) is the smallest is referred to as a tangent $SI1$, and a tangent at a point where the inclination of the switching loss $Et$ ($dI/dt$) is the largest is referred to as a tangent $SI2$. Similarly, a tangent at a point where an inclination of the switching loss $Et$ ($dV/dt$) is the smallest is referred to as a tangent $SV1$, and a tangent at a point where the inclination of the switching loss $Et$ ($dV/dt$) is the largest is referred to as a tangent $SV2$. In this case, the tangents $S11$, $S12$ and the tangents $SV1$, $SV2$ intersect each other when the gate voltage dependency $\Delta VgJ$ becomes $x1$. That is, the switching loss $Et$ ($dI/dt$) and the switching loss $Et$ ($dV/dt$) sharply change at the intersection point $x1$. Then, the gate voltage dependency $\Delta VgJ$ at the intersection point $x1$ is expressed by the following equation (23) based on the equations (5) to (22).

$$x1 = \Delta VgJ = (Vd \times Id - \Delta tmJ \times Id \times dV/dt)/g/(Cgd/Ciss)/(Vd - \Delta tmJ \times dV/dt) \tag{23}$$

In the equation (23), $g$ is $Id/(Vm - Vth)$ and indicates a conductance of the MOSFET 20. The same applies to $g$ in the following equations.

At an intersection point $x2$ of the switching loss $Et(dI/dt)$ and the switching loss $Et(dV/dt)$ is $Et(dI/dt) = Et(dV/dt)$. Therefore, the gate voltage dependency $\Delta VgJ$ at the intersection point $x2$ is given by the following equation (24) based on the equations (5) to (22).

$$x2 = \Delta VgJ = Vd/g/(Cgd/Ciss) \times (dI/dt/dV/dt) - \Delta tmJ/g/(Cgd/Ciss) \times dI/dt \tag{24}$$

The gate voltage dependency $\Delta VgJ$ of the minimum value $x3$ in the total switching loss $Esum$ is expressed by the following equation (25) based on the equations (5) to (22).

$$x3 = \Delta VgJ = 1/g/(Cgd/Ciss) \times \{(Vd \times Id \times dI/dt/dV/dt) \times (1 - (\Delta tmJ/Vd) \times dV/dt)\}^{1/2} \tag{25}$$

Therefore, the semiconductor device according to the present embodiment is configured such that the gate voltage dependency $\Delta VgJ$ of the JFET 10 is within a range equal to or greater than the equation (23) and equal to or less than the equation (24). In this case, the total switching loss $Esum$ can be minimized by configuring the semiconductor device so that the gate voltage dependency $\Delta VgJ$ satisfies the equation (25). Since the parasitic gate resistance $RJ$ of the JFET 10 is normally extremely small, $\Delta tmJ$ defined by the gate resistance $RJ$ can be ignored as shown in the equation (7). That is, $\Delta tmJ$ may be set to 0.

In the JFET 10 of the present embodiment, the adjustment region 117 is formed in the channel layer 114 as described above. As shown in FIG. 11, it is confirmed that the gate voltage dependency $\Delta VgJ$ can be easily changed by changing the dosage of the adjustment region 117. Specifically, it is confirmed that the gate voltage dependency $\Delta VgJ$ is increased by increasing the dosage of the adjustment region 117.

Therefore, in the present embodiment, the dosage of the adjustment region 117 is adjusted so that the gate voltage dependency $\Delta VgJ$ is within the range equal to or greater than the equation (23) and equal to or less than the equation (24). $\Delta$VgJ in FIG. 11 is the difference between the gate potential of the JFET 10 when the power supply voltage is 400 V and the gate potential of the JFET 10 when the power supply voltage is 0.5 V when a current of 40 A flows through the semiconductor device.

According to the present embodiment described above, the gate voltage dependency $\Delta$VgJ of the JFET 10 is within the range equal to or greater than the equation (23) and equal to or smaller than the equation (24). Therefore, switching loss can be reduced. In this case, the switching loss can be minimized particularly by setting the gate voltage dependency $\Delta$VgJ of the JFET 10 to the equation (25).

Furthermore, the JFET 10 includes the adjustment region 117 formed in the channel layer 114. Therefore, the gate voltage dependency $\Delta$VgJ of the JFET 10 can be easily adjusted by changing the dosage of the adjustment region 117. That is, according to the present embodiment, it is possible to reduce the switching loss while suppressing the complication of the configuration.

Furthermore, in the present embodiment, the body layer 115 is deeper than the gate layer 13. For this reason, the electric field strength tends to be higher on the bottom side of the body layer 115 than on the bottom side of the gate layer 13. Therefore, when a surge occurs, a breakdown is likely to occur in the region on the bottom side of the body layer 115, and the surge current easily flows into the body layer 115. As a result, it is possible to suppress a breakdown of the semiconductor device due to fusing of the gate wiring 118, and to improve surge resistance.

Modification of First Embodiment

Figure 12:
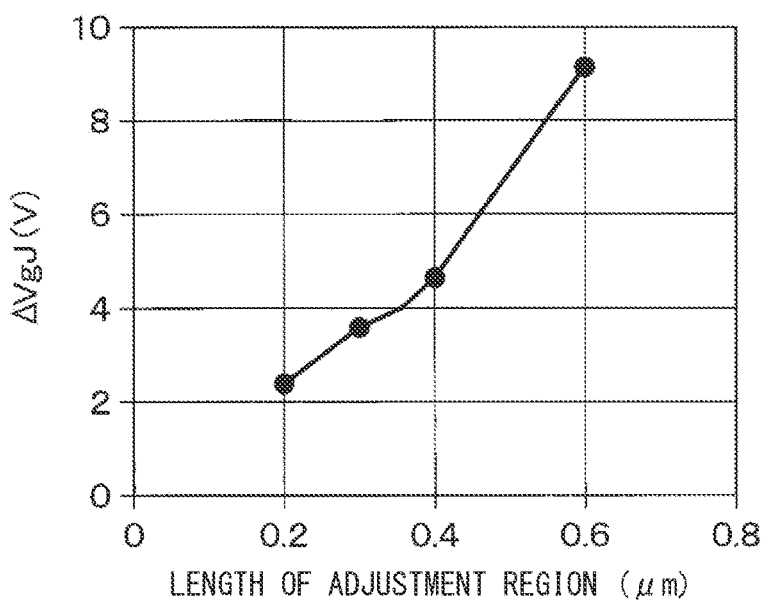
FIG. 12 is a diagram showing simulation results regarding the relationship between a length of the adjustment region and the gate voltage dependency.

The modification of the first embodiment will be described below. In the first embodiment described above, an example in which the gate voltage dependency $\Delta$VgJ is changed by changing the dosage of the adjustment region 117 of the JFET 10 has been described. However, when changing the gate voltage dependency $\Delta$VgJ of the JFET 10, the following configuration may be adopted. For example, when a length along the depth direction of the adjustment region 117 is referred to as a length L as shown in FIG. 4, the gate voltage dependency $\Delta$VgJ is changed by changing the length L, as shown in FIG. 12. Specifically, the gate voltage dependence $\Delta$VgJ is increased with increase of the length L of the adjustment region 117. Therefore, the length L of the adjustment region 117 may be adjusted so that the gate voltage dependency $\Delta$VgJ of the adjustment region 117 is within the range equal to or greater than the equation (23) and equal to or less than the equation (24).

Although not shown, the gate voltage dependency $\Delta$VgJ may be adjusted by changing a width of the adjustment region 117 along the planar direction of the semiconductor substrate 110, s depth of the adjustment region 117, or the like. The width of the adjustment region 117 means the length along the arrangement direction of the gate layer 13 and the body layer 115.

Second Embodiment

A second embodiment will be described. The present embodiment is different from the first embodiment in that the adjustment region 117 is not formed. The other configurations are the same as those of the first embodiment, and therefore a description of the same configurations will be omitted below.

Figure 13:
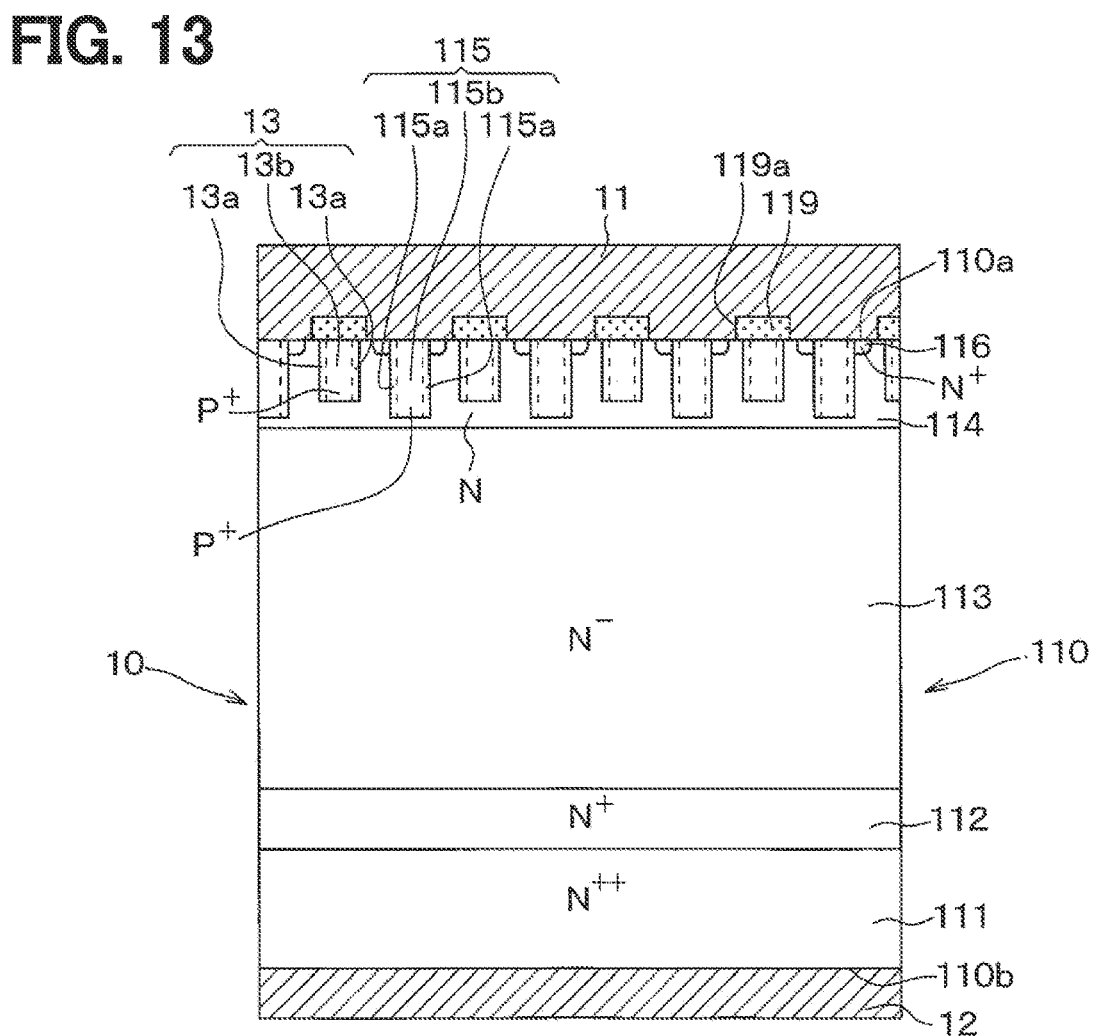
FIG. 13 is a cross-sectional view of a first semiconductor chip according to a second embodiment.

In the present embodiment, as shown in FIG. 13, the channel layer 114 has no adjustment region 117 formed therein. The gate layer 13 has an outer portion 13$a$ forming a side surface adjacent to the channel layer 114 and an inner portion 13$b$ positioned inside the outer portion 13$a$. Similarly, the body layer 115 has an outer portion 115$a$ forming a side surface adjacent to the channel layer 114, and an inner portion 115$b$ positioned inside the outer portion 115$a$. That is, the gate layer 13 and the body layer 115 have the outer portions 13$a$ and 115$a$ facing each other and the inner portions 13$b$ and 115$b$ located between the outer portions 13$a$ and 115$a$.

The outer portion 13$a$ and the inner portion 13$b$ of the gate layer 13 have different impurity concentrations. Similarly, the outer portion 115$a$ and the inner portion 115$b$ of the body layer 115 have different impurity concentrations. In the present embodiment, the outer portion 13$a$ of the gate layer 13 and the outer portion 115$a$ of the body layer 115 have the same impurity concentration. The inner portion 13$b$ of the gate layer 13 and the inner portion 115$b$ of the body layer 115 have the same impurity concentration.

Figure 14:
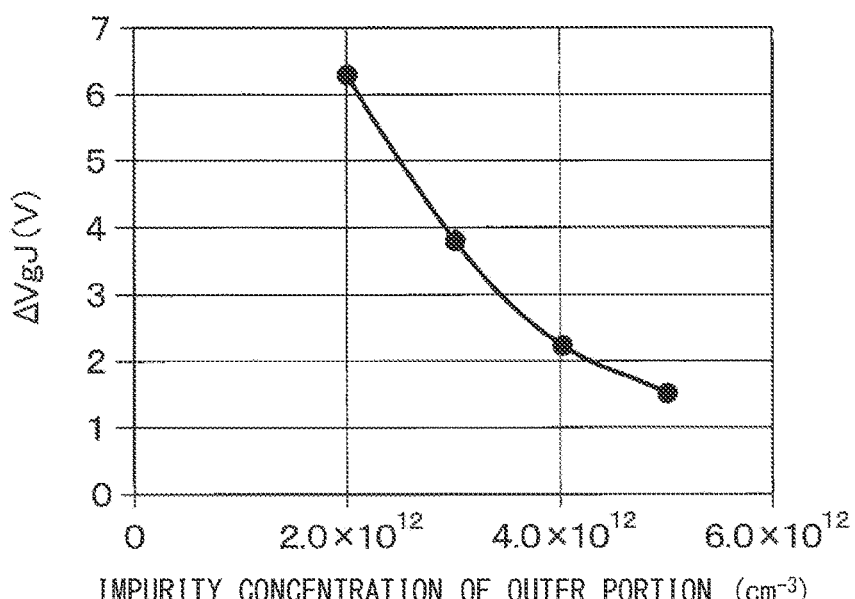
FIG. 14 is a diagram showing simulation results regarding the relationship between an impurity concentration of an outer portion and a gate voltage dependency.

A shown in FIG. 14, the gate voltage dependency $\Delta$VgJ of the JFET 10 decreases with increase of the impurity concentration of the outer portions 13$a$ and 115$a$. Therefore, in the present embodiment, the impurity concentration of the outer portion 13$a$ of the gate layer 13 and the outer portion 115$a$ of the body layer 115 is adjusted so that the gate voltage dependency $\Delta$VgJ is within the range equal to or greater than the equation (23) and equal to or less than the equation (24). It should be noted that FIG. 14 shows simulation results when the impurity concentration of the inner portions 13$b$ and 115$b$ is set to $1.0 \times 10^{18}$ cm$^{-3}$.

As described above, the impurity concentration of the outer portion 13$a$ of the gate layer 13 and the outer portion 115$a$ of the body layer 115 may be adjusted so that the gate voltage dependency $\Delta$VgJ of the JFET 10 is within the range equal to or greater than the equation (23) and equal to or less than the equation (24). Such a structure also makes it possible to achieve the similar advantageous effects as those in the first embodiment.

Modification of Second Embodiment

The modification of the second embodiment will be described below. In the second embodiment, the gate voltage dependency $\Delta$VgJ of the JFET 10 is adjusted by changing the impurity concentration between the outer portions 13$a$ and 115$a$ and the inner portions 13$b$ and 115$b$ of the gate layer 13 and the body layer 115. However, in the second embodiment, if the gate voltage dependency $\Delta$VgJ of the JFET 10 is equal to or greater than the equation (23) and equal to or less than the equation (24), the following configuration may be adopted. For example, only the outer portion 13$a$ and the inner portion 13$b$ of the gate layer 13 may have different impurity concentrations, and the outer portion 115$a$ and the inner portion 115$b$ of the body layer 115 may have the same impurity concentration. Alternatively, the outer portion 13$a$ of the gate layer 13 and the outer portion 115$a$ of the body layer 115 may have different impurity concentrations if the gate voltage dependency $\Delta$VgJ of the JFET 10 is within the range equal to or greater than the equation (23) and equal to or less than the equation (24).

Third Embodiment

A third embodiment will be described. The present embodiment is different from the first embodiment in that a capacitance ratio of the MOSFET 20 is defined. The other configurations are the same as those of the first embodiment, and therefore a description of the same configurations will be omitted below.

The configuration of the semiconductor device of the present embodiment is similar to that of the first embodiment. The JFET 10 of the present embodiment may or may not have the adjustment region 117.

In the first embodiment, the configuration for reducing the switching loss by adjusting the gate voltage dependency ΔVgJ of the JFET 10 has been described. However, the switching loss may be reduced as follows. Specifically, when a ratio of the mirror capacitance Cgd to the input capacitance Ciss of the MOSFET 20 is referred to as the capacitance ratio Cgd/Ciss, the semiconductor device in which the JFET 10 and the MOSFET 20 are cascode-connected satisfies the following relationship. That is, the capacitance ratio Cgd/Ciss and the gate voltage dependency ΔVgJ of the JFET 10 are in an inversely proportional relationship. Therefore, the equation (23) is also expressed by the following equation (26). The equation (24) is also expressed by the following equation (27). The equation (25) is also expressed by the following equation (28). Since the parasitic gate resistance RJ of the JFET 10 is normally small, ΔtmJ defined by the gate resistance RJ can be ignored as shown in the equation (7). That is, ΔtmJ may be set to 0.

$$x1 = Cgd/Ciss = Id/g/\Delta VgJ \tag{26}$$

$$x2 = Cgd/Ciss = (Vd/\Delta VgJ) \times dI/dt/(g \times dV/dt) - \Delta tmJ/ \\ \Delta VgJ/(g \times dI/dt) \tag{27}$$

$$x3 = Cgd/Ciss = (1/g/\Delta VgJ) \times \{(Id \times Vd)/(dI/dt/dV/dt) \times \{1- \\ (\Delta tmJ/Vd) \times dV/dt\}^{1/2} \tag{28}$$

Therefore, the semiconductor device of the present embodiment is configured such that the capacitance ratio Cgd/Ciss of the MOSFET 20 is within a range equal to or greater than the equation (26) and is equal to or less than the equation (27). In this case, the total switching loss Esum can be minimized by configuring the semiconductor device such that the capacitance ratio Cgd/Ciss satisfies the equation (28).

Note that the capacitance ratio Cgd/Ciss of the MOSFET 20 can be easily changed by adjusting the depth of the contact layer 217, for example. The capacitance ratio Cgd/Ciss of the MOSFET 20 can also be easily changed by forming a p-type impurity layer between the gate electrode 23 and the drain electrode 22, for example.

As described above, the switching loss may be reduced by adjusting the capacitance ratio Cgd/Ciss of the MOSFET 20.

Fourth Embodiment

The following describes a fourth embodiment. In the present embodiment, an inverter is formed using the semiconductor device of the first embodiment. The other configurations are the same as those of the first embodiment, and therefore a description of the same configurations will be omitted below.

Figure 15:
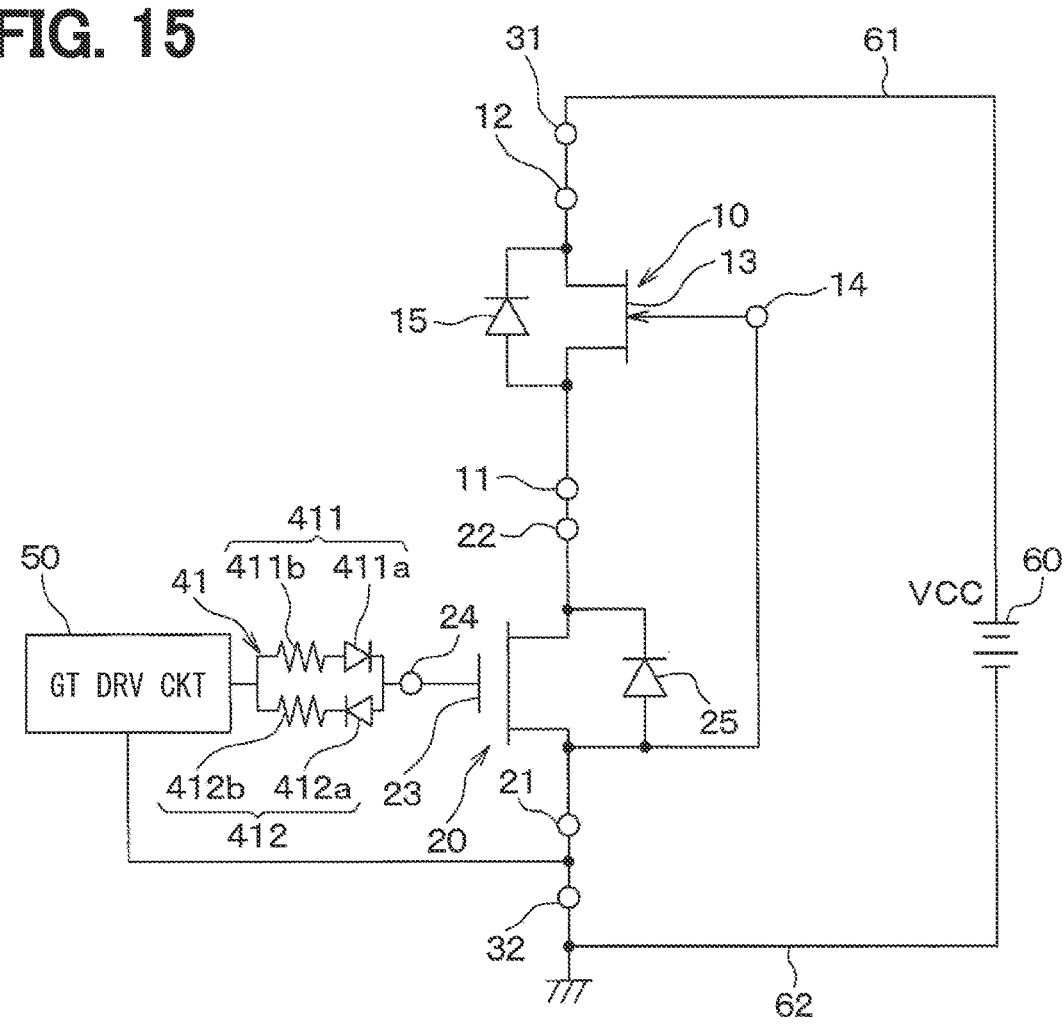
FIG. 15 is a circuit diagram of a semiconductor device according to a fourth embodiment.

In the present embodiment, as shown in FIG. 15, the adjustment resistor 41 has the following configuration. The adjustment resistor 41 includes a first resistor circuit 411 in which a first diode 411a and a first resistor 411b are connected in series, and a second resistor circuit 412 in which a second diode 412a and a second resistor 412b are connected in series. The first resistor circuit 411 and the second resistor circuit 412 are arranged in parallel such that a cathode of the first diode 411a and an anode of the second diode 412a are connected to the gate electrode 23 of the MOSFET 20.

In the present embodiment, the gate electrode 23 of the MOSFET 20 and the gate driving circuit 50 are connected via the adjustment resistor 41 as described above. Therefore, the switching speed of the MOSFET 20 is adjusted by different resistance circuits between a case of the switching-on operation and a case of the switching-off operation.

Specifically, the gate electrode 23 of the MOSFET 20 is connected to the gate drive circuit 50 via the first resistance circuit 411 when the switching-on operation is performed. That is, the first resistance circuit 411 functions as a speed adjustment resistor for switching-on operation of the MOSFET 20. The gate electrode 23 of the MOSFET 20 is connected to the gate drive circuit 50 via the second resistance circuit 412 when the switching-off operation is performed. That is, the second resistance circuit 412 functions as a speed adjustment resistor for switching-off operation of the MOSFET 20. Therefore, the switching speed of the MOSFET 20 can be appropriately adjusted by adjusting the resistance values of the resistance circuits 411 and 412.

The configuration of the semiconductor device according to the present embodiment has been described above. The semiconductor device can be used as a switching element of an inverter circuit that drives a three-phase motor, for example, as shown in FIG. 16.

Figure 16:
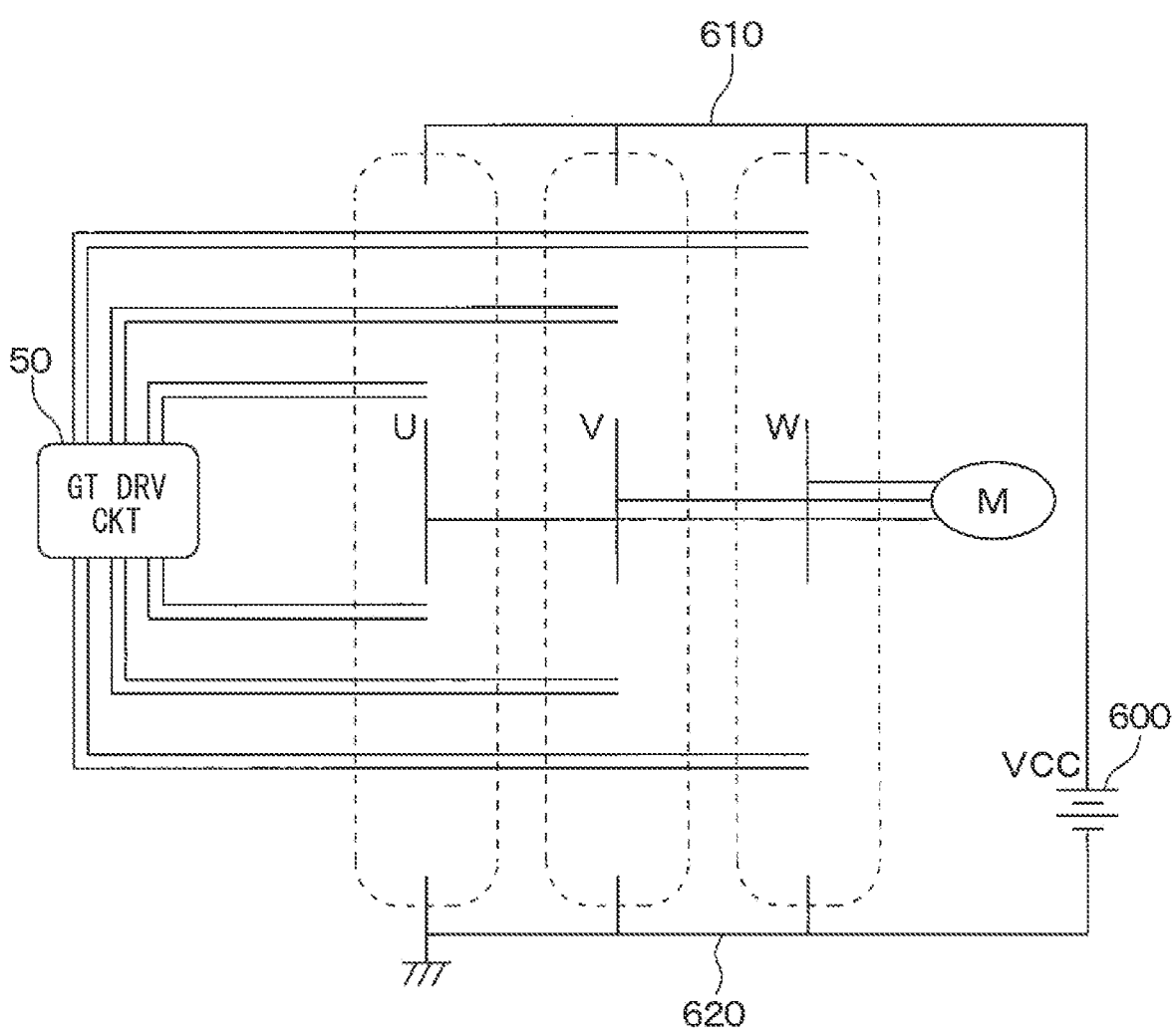
FIG. 16 is a circuit diagram of an inverter configured using the semiconductor device shown in FIG. 15.

That is, as shown in FIG. 16, the inverter has three circuits of U-phase, V-phase, and W-phase between a power supply line 610 to which a voltage Vcc from a power supply 600 is applied and a ground line 620 connected to the ground. Each layer is connected to the gate drive circuit 50 and a three-phase motor M. Hereinafter, the detailed configuration of the U layer will be described with reference to FIG. 17. Note that the detailed configuration of the V layer and the W layer is the same as that of the U layer, and is omitted to explain.

Figure 17:
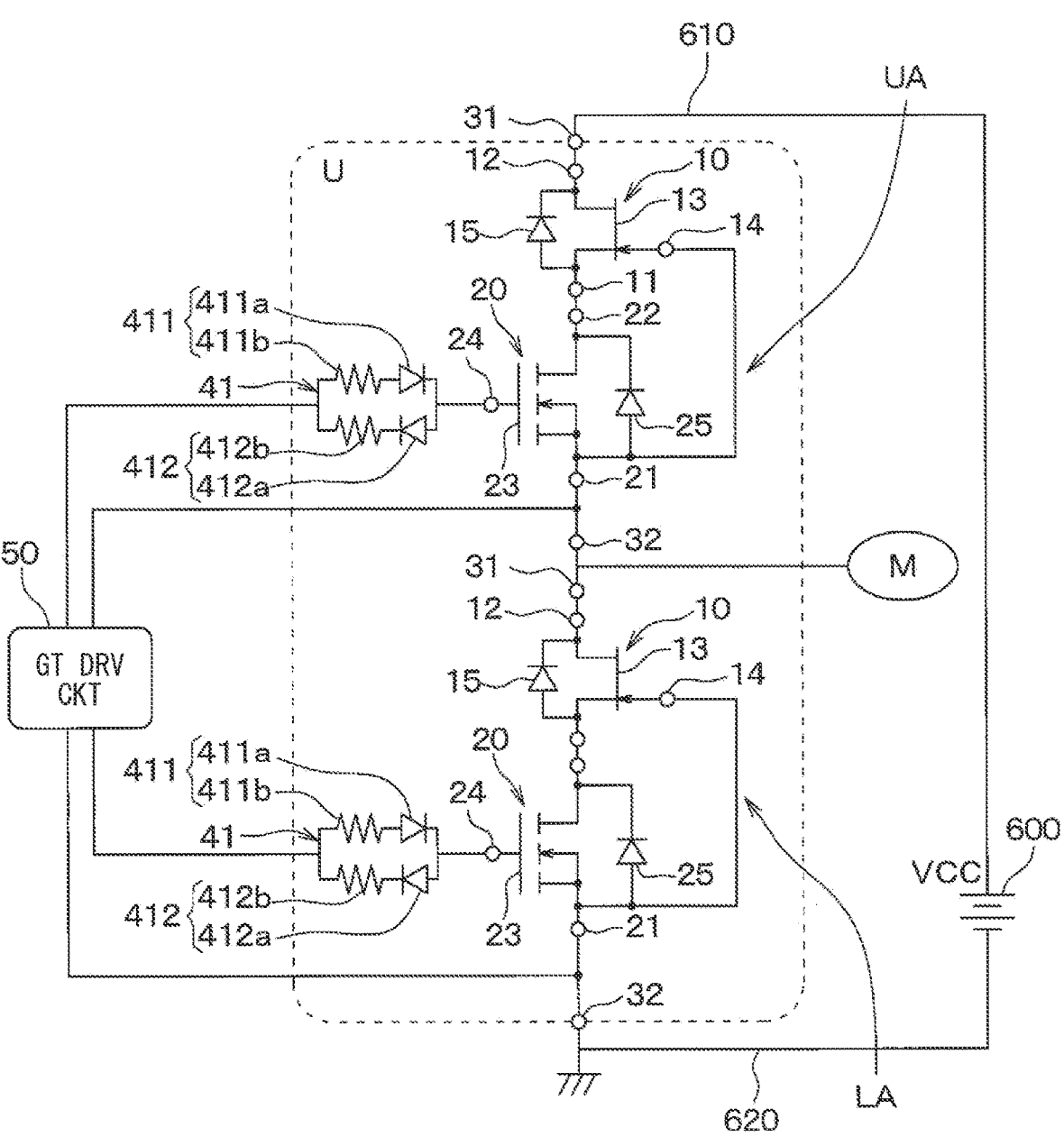
FIG. 17 is a circuit diagram of a U layer in FIG. 16.

As shown in FIG. 17, the U layer is configured to include two semiconductor devices shown in FIG. 15. In the U layer, the drain electrode 12 of the JFET 10 in an upper arm UA is connected to the power supply line 610 via the first terminal 31. In the U layer, the source electrode 21 of the MOSFET 20 in a lower arm LA is connected to the ground line 620 via the second terminal 32. In addition, the source electrode 21 of the MOSFET 20 in the upper arm UA is electrically connected to the drain electrode 12 of the JFET 10 in the lower arm LA. That is, the second terminal 32 of the upper arm UA is electrically connected to the first terminal 31 of the lower arm LA. The three-phase motor M is connected between the second terminal 32 of the upper arm UA and the first terminal 31 of the lower arm LA. The gate electrodes 23 of the MOSFETs 20 in the upper arm UA and the lower arm LA are connected to the gate drive circuit 50.

As described above, the semiconductor device of the present embodiment may also be used as the switching element of the inverter.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

For example, in each of the above embodiments, the first conductivity type may be P type and the second conductivity type may be N type. That is, the JFET 10 and the MOSFET 20 may be of a P-channel type.

In each of the above-described embodiments, the gate layer 13 and the body layer 115 may have the same depth. The configuration in which the electric field intensity is higher on the bottom side of the body layer 115 than on the bottom side of the gate layer 13 can be changed as appropriate. For example, when the bottom of the body layer 115 may be tapered or the width of the body layer 115 may be narrower than the width of the gate layer 13, the electric field strength tends to be higher on the bottom side of the body layer 115 than on the bottom side of the gate layer 13.

In each of the above-described embodiments, the JFET 10 may be configured using a silicon substrate, or may be configured using another compound semiconductor substrate or the like. Similarly, the MOSFET 20 may be configured using a SiC substrate, or may be configured using another compound semiconductor substrate.

Furthermore, in each of the above embodiments, the MOSFET 20 may be of a planar gate type in which the gate electrode 23 is disposed on the one surface 210*a* of the semiconductor substrate 210 instead of the trench gate type.

The above-described embodiments may be combined with one another as appropriate. For example, the first embodiment may be combined with the second embodiment to form the adjustment region 117 while the gate layer 13 and the body layer 115 have the outer portions 13*a* and 115*a*. The first and second embodiments may be combined with the third embodiment to adjust the capacitance ratio Cgd/Ciss of the MOSFET 20 while adjusting the gate voltage dependency ΔVgJ. Combinations of the above embodiments may be further combined with each other.

What is claimed is:

1. A semiconductor device comprising:
a junction field effect transistor (JFET) including a source electrode, a drain electrode, and a gate electrode; and
a metal oxide semiconductor field effect transistor (MOSFET) including a source electrode, a drain electrode, and a gate electrode, wherein
the JFET and the MOSFET are cascode-connected such that the source electrode of the JFET and the drain electrode of the MOSFET are electrically connected, and
when a drain voltage dependency of a gate voltage of the JFET is referred to as a gate voltage dependency denoted by ΔVgJ, ΔVgJ is within a range equal to or greater than the following equation (1) and equal to or less than the following equation (2):

$$\Delta VgJ=(Vd\times Id-\Delta tmJ\times Id\times dV/dt)/g/(Cgd/Ciss)/(Vd-\Delta tmJ\times dV/dt) \quad (1)$$

$$\Delta VgJ=Vd/g/(Cgd/Ciss)\times(dI/dt/dV/dt)-\Delta tmJ/g/(Cgd/Ciss)\times dI/dt \quad (2),$$

where dI/dt denotes a current change rate, dV/dt denotes a voltage change rate, Vd denotes a power supply voltage, Id denotes an operating current, ΔtmJ denotes a delay time of the JFET, Cgd denotes a mirror capacitance of the MOSFET, Ciss denotes an input capacitance of the MOSFET, Vm denotes a gate mirror potential of the MOSFET, Vth denotes a gate threshold of the MOSFET, and g denotes Id/(Vm−Vth).

2. The semiconductor device according to claim 1, wherein
the gate voltage dependency satisfies the following equation (5):

$$\Delta VgJ=1/g/(Cgd/Ciss)\times\{(Vd\times Id\times dI/dt/dV/dt)\times(1-(\Delta tmJ/Vd)\times dV/dt)\}^{1/2} \quad (5).$$

3. The semiconductor device according to claim 1, wherein
the JFET further includes:
a drift layer having a first conductivity type;
a channel layer having the first conductivity type and disposed on the drift layer;
a source layer having the first conductivity type with an impurity concentration higher than the channel layer and disposed in a surface layer portion of the channel layer;
a gate layer as the gate electrode having a second conductivity type and disposed in the channel layer to be deeper than the source layer;
a body layer having the second conductivity type, disposed in the channel layer to be deeper than the source layer, and separated from the gate layer; and
a drain layer having the first conductivity type and disposed on a side of the drift layer opposite from the source layer, wherein
the source electrode of the JFET is electrically connected to the source layer and the body layer, and
the drain electrode of the JFET is electrically connected to the drain layer.

4. The semiconductor device according to claim 3, wherein
the channel layer has an adjustment region at a portion located between the gate layer and the body layer, and
the adjustment region is configured so that the gate voltage dependency is within the range.

5. The semiconductor device according to claim 4, wherein
the adjustment region has a dosage adjusted so that the gate voltage dependency is within the range.

6. The semiconductor device according to claim 4, wherein
the adjustment region has a length along a stacking direction of the drift layer and the channel layer adjusted so that the gate voltage dependency is within the range.

7. The semiconductor device according to claim 3, wherein
at least one of the gate layer or the body layer has an outer portion that forms a side surface adjacent to the channel layer, and an inner portion positioned inside the outer portion, and
the outer portion and the inner portion has different impurity concentrations.

8. A semiconductor device comprising:
a junction field effect transistor (JFET) including a source electrode, a drain electrode, and a gate electrode; and
a metal oxide semiconductor field effect transistor (MOSFET) including a source electrode, a drain electrode, and a gate electrode, wherein
the JFET and the MOSFET are cascode-connected such that the source electrode of the JFET and the drain electrode of the MOSFET are electrically connected,
when a mirror capacitance of the MOSFET is denoted by Cgd, an input capacitance of the MOSFET is denoted by Ciss, and a capacitance ratio of the mirror capacitance to the input capacitance is denoted by Cgd/Ciss, Cgd/Ciss is within a range equal to or greater than the following equation (3) and equal to or less than the following equation (4):

$$Cgd/Ciss = Id/g/\Delta VgJ \tag{3}$$

$$Cgd/Ciss = (Vd/\Delta VgJ) \times dI/dt/(g \times dV/dt) - \Delta tmJ/\Delta VgJ/(g \times dI/dt) \tag{4},$$

where $\Delta VgJ$ denotes a gate voltage dependency as a drain voltage of a gate voltage of the JFET, dI/dt denotes a current change rate, dV/dt denotes a voltage change rate, Vd denotes a power supply voltage, Id denotes an operating current, $\Delta tmJ$ denotes a delay time of the JFET, Vm denotes a gate mirror potential of the MOSFET, Vth denotes a gate threshold of the MOSFET, and g denotes Id/(Vm–Vth).

9. The semiconductor device according to claim 8, wherein the capacitance ratio satisfies the following equation (6):

$$Cgd/Ciss = (1/g/\Delta VgJ) \times \{(Id \times Vd)/(dI/dt/dV/dt) \times \{1 - (\Delta tmJ/Vd) \times dV/dt\}^{1/2} \tag{6}.$$

* * * * *